United States Patent
Suzuki et al.

(10) Patent No.: US 7,634,238 B2
(45) Date of Patent: *Dec. 15, 2009

(54) MULTI-BAND LOOKUP TABLE TYPE PREDISTORTER

(75) Inventors: Yasunori Suzuki, Yokohama (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 439 days.

This patent is subject to a terminal disclaimer.

(21) Appl. No.: 11/444,494

(22) Filed: Jun. 1, 2006

(65) Prior Publication Data

US 2006/0276146 A1    Dec. 7, 2006

(30) Foreign Application Priority Data

Jun. 3, 2005  (JP)  .............................. 2005-164436

(51) Int. Cl.
 *H04B 1/04*    (2006.01)
(52) U.S. Cl. .................. 455/114.3; 455/552.1; 455/105
(58) Field of Classification Search .............. 455/114.2, 455/114.3, 552.1, 93, 103, 105
See application file for complete search history.

(56) References Cited

U.S. PATENT DOCUMENTS

| | | | |
|---|---|---|---|
| 6,996,378 B2 * | 2/2006 | Helms | 455/91 |
| 6,999,523 B2 * | 2/2006 | Posti | 375/296 |
| 7,038,540 B2 * | 5/2006 | Gurvich et al. | 330/151 |
| 7,142,615 B2 * | 11/2006 | Hongo et al. | 375/297 |
| 7,183,847 B2 * | 2/2007 | Suzuki et al. | 330/149 |
| 7,340,005 B2 * | 3/2008 | Kim et al. | 375/296 |
| 2001/0014592 A1 | 8/2001 | Helms | |
| 2003/0053552 A1 | 3/2003 | Hongo et al. | |
| 2004/0105510 A1 | 6/2004 | Tomerlin et al. | |
| 2005/0162225 A1 | 7/2005 | Suzuki et al. | |
| 2005/0168283 A1 | 8/2005 | Suzuki et al. | |

(Continued)

FOREIGN PATENT DOCUMENTS

EP       1 394 954 A2     3/2004

(Continued)

OTHER PUBLICATIONS

U.S. Appl. No. 11/434,068, filed May 16, 2006, Mizuta et al.

(Continued)

*Primary Examiner*—Edward Urban
*Assistant Examiner*—Christian A Hannon
(74) *Attorney, Agent, or Firm*—Oblon, Spivak, McClelland, Maier & Neustadt, L.L.P.

(57) ABSTRACT

A lookup table type predistorter for reading out distortion compensation data by using a difference signal between a power amplifier input signal and an output signal as a reference signal; wherein N input side variable band signal extractors extract transmitting signals in N frequency bands from the input signal, N output side variable band signal extractors extract signals in N frequency bands from the output of power amplifier, and N difference detectors detect differences between N frequency band signals respectively detected at the input side and the output side as N reference signals, which are used to read out N compensation data from N lookup tables, the N compensation data are added to the transmitting signals in N frequency bands, and N results of addition are combined to produce an output of the predistorter.

3 Claims, 14 Drawing Sheets

U.S. PATENT DOCUMENTS

| | | |
|---|---|---|
| 2005/0180527 A1 | 8/2005 | Suzuki et al. |
| 2005/0189990 A1 | 9/2005 | Mizuta et al. |
| 2006/0088124 A1 | 4/2006 | Mizuta et al. |

FOREIGN PATENT DOCUMENTS

| | | |
|---|---|---|
| EP | 1 560 327 A1 | 8/2005 |
| GB | 2 335 812 A | 9/1999 |
| GB | 2 351 624 A | 1/2001 |
| JP | 06-132847 | 5/1994 |
| JP | 07-50841 | 5/1995 |
| JP | 2002-280999 | 9/2002 |
| JP | 2003-092518 | 3/2003 |
| JP | 2003-143020 | 5/2003 |
| JP | 2004-128867 | 4/2004 |

OTHER PUBLICATIONS

U.S. Appl. No. 11/446,381, filed Jun. 5, 2006, Suzuki et al.

Henri Girard, et al., "A New Baseband Linearizer for More Efficient Utilization of Earth Station Amplifiers Used for QPSK Transmission", IEEE Journal on Selected Areas in Communications, vol. SAC-1, No. 1, Jan. 1983, pp. 46-56.

Toshio Nojima, et al., Analysis and Compensation of TWT Nonlinearities Based on Complex Power Series Representation, The IEICE Transactions B, vol. J64-B, No. 12, Dec. 1981, pp. 1449-1456.

Lars Sundström, et al., "Quantization Analysis and Design of a Digital Predistortion Linearizer for RF Power Amplifiers", IEEE Transactions on Vehicular Technology, vol. 45, No. 4, Nov. 1996, pp. 707-719.

* cited by examiner

MULTI-BAND LOOKUP TABLE TYPE PREDISTORTER

TECHNICAL FIELD

The present invention relates to a predistorter that compensates for a distortion of a power amplifier for amplifying power of high frequency signals that changes in a plurality of frequency bands. More specifically, the present invention relates to a multi-band lookup table type predistorter for collectively amplifying high frequency signals of a plurality of bands.

BACKGROUND ART

The predistortion linearizer method based on digital signal processing (hereinafter referred to as a digital predistortion method) (for example, GB 2 335 812 A, hereinafter referred to as Patent literature 1) is known as one of the non-linear compensation method for a microwave power amplifier. The digital predistortion method is characteristic in that a complicate analog circuit is eliminated by implementing a predistorter using digital signal processing. A conventional linear amplifier such as a feed forward amplifier or a negative feedback amplifier is mainly realized by an analog circuit. The predistorter is also realized by an analog circuit (for example, H. Girard and K. Feher, "A new baseband linearizer for more efficient utilization of earth station amplifiers used for QPSK transmission", IEEE J. Select. Areas Commun. SAC-1, No. 1, 1983, hereinafter referred to as Non Patent literature 1, and Nojima and Okamoto, "Analysis and Compensation of TWT Nonlinearities Based on Complex Power Series Representation", the IEICE Transactions B, Vol. J64-B, No. 12, December 1981, hereinafter referred to as Non Patent literature 2). The art of the analog linearization circuits, however, generally requires a highly accurate adjustment technique. The analog circuits need to be easily configured to be simple in order to make a transmitter including a modulator more compact and more cost effectiveness.

As a conventional digital predistorter, a configuration having a lookup table for linearizing non-linear characteristics of an amplifier has been known (for example, L. Sundstrom, M. Faulkner, and M. Johansson, "Quantization analysis and design of a digital predistortion linearizer for RF power amplifiers", IEEE Trans. Vech. Tech., Vol. 45, No. 4, pp. 707-719, 1996. 11, hereinafter referred to as Non Patent literature 3). A lookup table type predistorter reads out distortion compensation data from a lookup table by using a difference signal between the input signal of the power amplifier and the output signal of the power amplifier and adds the distortion compensation data to the input signal of the power amplifier. If distortion component is completely compensated for in the output signal of the power amplifier, i.e., the output signal of the power amplifier has been linealized, the difference signal would become nothing. In the lookup table type predistorter, the lookup table is updated in stages so that an absolute value of the difference signal is nothing. In such a manner, the lookup table type predistorter can perform distortion compensation without previously recognizing non-linear characteristics of the power amplifier.

For the existing wireless systems, for example, PDC (Personal Digital Cellular), GSM (Global System for Mobile Communications), IMT-2000 (International Mobile Telecommunication 2000) have been operated. It is known that each wireless system allocates each frequency band. On the other hand, an art for realizing software defined radio so that a single hardware accommodates a plurality of wireless systems has been known. If a single hardware can accommodate a plurality of wireless systems, a user of the single hardware can use a single mobile communication provided by a wireless system without being aware of a wireless system or a core network behind the wireless system. Such a single hardware corresponding to a plurality of wireless systems, however, has not been actually realized.

As the services provided by wireless systems differ for each area or for each operator, wireless systems required for the services will also be diversified. For that purpose, wireless systems suitable for respective objects need to be mixed in the same period of time and in the same place.

As a transmission method for using the plurality of wireless systems, a multi-band wireless system has been known. The wireless system makes use of one or more of frequency bands to be used according to a propagation environment or a traffic status variable in accommodative manner. A multi-band transmission by using an unused frequency band is effective to reserve predetermined quality or predetermined capacity of transmission. In a multi-band wireless system, the number of frequency bands used can be always changed depending on a transmission status to be secured in each wireless system. Similarly, a bandwidth can also be changed in the same band. If a frequency band used by a business entity is different from a frequency band used by anther business entity, the multi-band wireless system can improve efficiency of using a frequency by executing adaptive transmission control so as to use a free frequency band based on the technologies of interference recognition, frequency sharing, interference canceling, suppression of giving-interference, or multi-band controlling.

In the base station lookup table type predistorter accommodating such a multi-band wireless system, a frequency range to which distortion compensation is available requires generally more than three times transmission bandwidth centering on a carrier frequency. For example, a system for transmitting both signals in 800 MHz band and in 1.5 GHz band simultaneously, it is not possible to achieve predetermined distortion compensation while performing distortion compensation on the frequency band signals. Because it is known that the conventional look-up table type predistorter can operate less than 20-MHz bandwidth. Therefore, in order to transmit signals in a plurality of frequency bands, while executing distortion compensation by using a lookup table type predistorter, the transmitter needs to build a lookup table type predistorter for each frequency band and also prepare a vector modulator, a frequency converter and a power amplifier for each frequency band. That makes the entire device cumbersome, increases power consumption and overgrows a device.

If the transmitter can collectively execute a lookup table type predistortion processing on a plurality of frequency bands, it can simplify a device, suppress power consumption and downsize the device. When the transmitter is about to execute lookup table type distortion processing on a plurality of frequency bands by using a single lookup table under the condition that frequency bands are away from each other by frequency separation more than a bandwidth between respective frequency bands such as 800 MHz and 1.5 GHz, a compensation parameter stored in the lookup table would be inaccurate to signals in both frequency bands simultaneously. Therefore, distortion components produced in both frequency bands cannot be appropriately compensated for.

In a multi-band wireless system with a plurality of transmission frequency bands, it can be assumed that a frequency band may be changed in consideration of a service state of the wireless system and interference or the like to the other wireless systems. When a frequency band in such a wireless system is being changed, a conventional lookup table type predistorter that has a fixed frequency band to execute distortion compensation cannot adaptively change even an operating frequency. The lookup table type predistorter used for a long time needs to execute lookup table type predistorter modification and change at each base station for changing a frequency band. That requires tremendous time and effort to readjust many lookup table type predistorters. Therefore, a lookup table type predistorter configuration for making a transmitter more cost effectiveness by eliminating the requirements mentioned above is needed now.

For example, the lookup table type predistorter, which can execute distortion compensation in the frequencies f1 and f2 simultaneously, cannot execute the distortion compensation in the frequencies f1 and f3 simultaneously when the frequency band for signals used is changed from f2 to f3. This is because that an operating frequency band for conventional lookup table type predistorter is fixed.

Conventional lookup table type predistorters cannot adaptively change a frequency band to be subject to distortion compensation and the bandwidth, when frequency bands of a wireless system are being changed. Conventionally, it is required to update or exchange a lookup table type predistorter for each of plural frequency bands.

SUMMARY OF THE INVENTION

The present invention intends to provide a lookup table type predistorter that can easily execute distortion compensation on a plurality of frequency bands.

According to the present invention, a multi-band lookup table type predistorter for adding predistortion components for canceling distortion components produced by a power amplifier to an input transmitting signal and outputting the result is adapted to include:

N output side variable band signal extractors for extracting output signals in N frequency bands from output signals from the power amplifier, wherein N is an integer of 2 or greater;

N difference detectors for detecting differences between transmitting signals in N frequency bands and N output signals from said N output side variable band signal extractors;

N lookup tables for reading distortion compensation data of corresponding N frequency bands by using differences of said N frequency bands as reference signals;

N adders for adding said distortion compensation data read out from said N lookup tables to the transmitting signals in the corresponding N frequency bands;

a combiner for combining the added outputs from said N adders and outputting the combined result as a transmitting signal with the predistortion; and a frequency band controller for controlling frequency bands of said N output side variable band signal extractors.

BEST MODES FOR CARRYING OUT THE INVENTION

Figure 1:
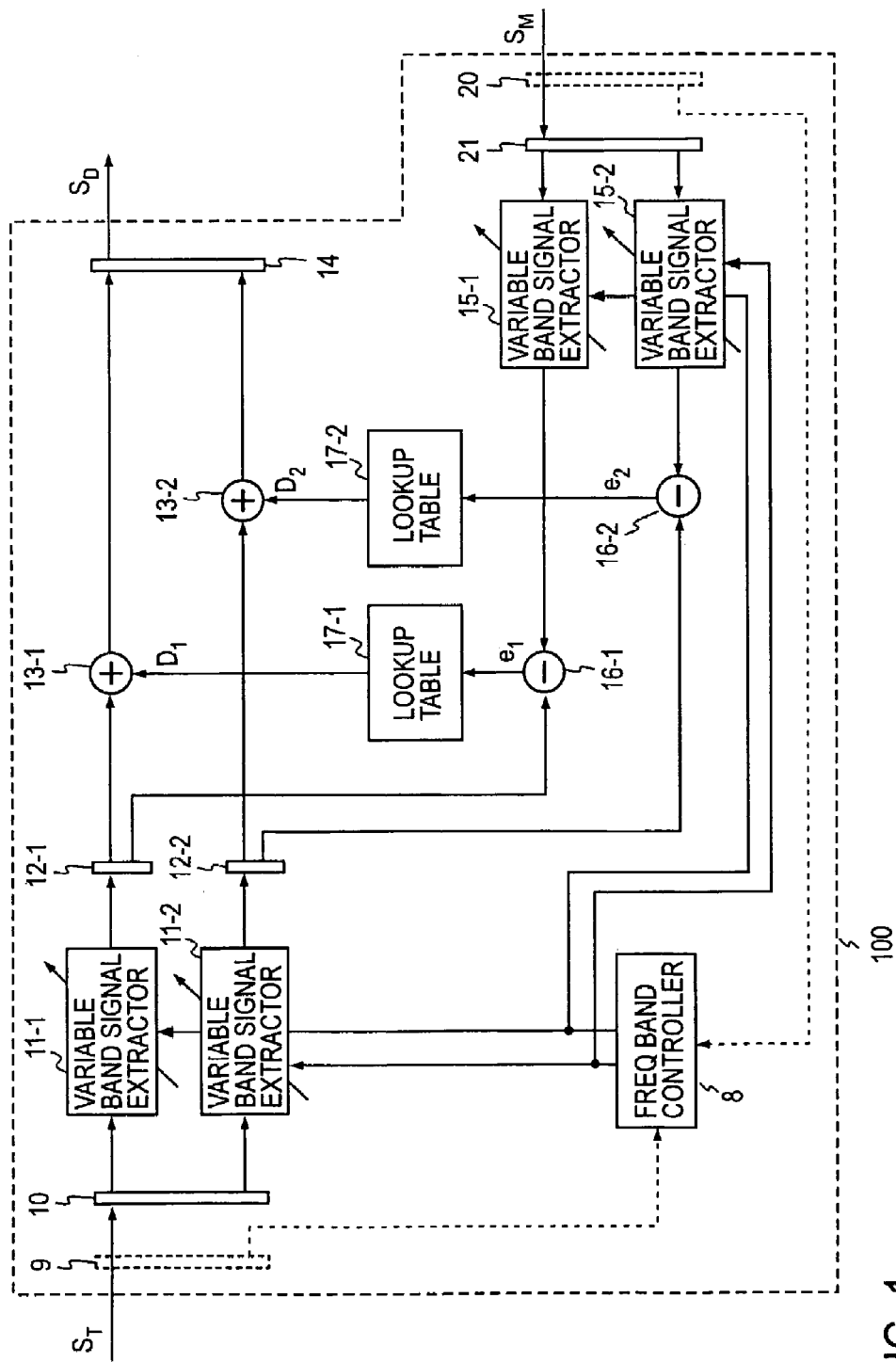
FIG. 1 is a diagram showing the first embodiment of a multi-band lookup table type predistorter of the present invention.

Embodiments of the present invention will be described with reference to drawings. Like reference numerals are given to like components in the drawings, and repeated descriptions for them will be avoided.

FIRST EMBODIMENT

FIG. 1 shows the first embodiment of a lookup table type predistorter that implements distortion compensation for a plurality of different frequency bands simultaneously. FIG. 1 shows a case where the frequency of an input transmitting signal $S_T$ to a predistorter 100 may be of an intermediate frequency or a wireless frequency. Those parts related to frequency conversion and demodulating and feeding back from a power amplifier, which are used when required, are omitted in the figure for simplicity. A digital-to-analog converter (hereinafter referred to as a DAC) and an analog-to-digital converter (hereinafter referred to as an ADC) with regard to input/output to/from lookup tables 17-1 and 17-2 usually consisting of a memory are also omitted.

The transmitting signal $S_T$ is inputted from a transmitter (not shown) to a divider 10. The divider 10 consists of a wide band directional coupler, for example. Although FIG. 1 shows the case where the predistorter performs distortion compensation only on signals in dual frequency bands at the same time for simplicity, the predistorter can be adapted for signals in three or more frequency bands.

The input signal $S_T$ including dual frequency bands of transmitting signals is divided into two input side variable band signal extractors 11-1 and 11-2 at the divider 10 and transmitting signals in dual frequency bands are extracted. It is assumed that a frequency band controller 8 sets the variable band signal extractor 11-1 to extract transmitting signal of 800 MHz band and the variable band signal extractor 11-2 to extract transmitting signal of 1.5 GMz band. One of the transmitting signals extracted in the dual frequency bands is divided to an adder 13-1 and a difference detector 16-1 at a divider 12-1, and the other of the transmitting signals is divided to an adder 13-2 and a difference detector 16-2 at a divider 12-2. One of the divided transmitting signals in each of the frequency bands is supplied through corresponding one of the adders 13-1 and 13-2 to the combiner 14 and combined with the other transmitting signal, and the combined signal is provided to a power amplifier (not shown) as an output signal SD of the predistorter 100.

A part of an output of a power amplifier, which is to be subject to distortion compensation by the predistorter 100, is fed back as a monitor signal $S_M$ and divided into output side variable band signal extractors 15-1 and 15-2 by a divider 21. The variable band signal extractors 15-1 and 15-2 extract signals in the same frequency bands as those of the variable band signal extractors 11-1 and 11-2, respectively, and provide the extracted signals to the difference detectors 16-1 and 16-2, respectively. The difference detectors 16-1 and 16-2 detect differences $e_1$ and $e_2$ between transmitting signals and the amplifier output signals (monitor signal $S_M$) in the corresponding frequency bands. Thus, distortion components produced by the power amplifier in the respective frequency bands are detected as the difference signals. By using the differences $e_1$ and $e_2$ detected in respective frequency bands, i.e., distortion components, as reference signals, corresponding distortion compensation data are read out from the lookup tables 17-1 and 17-2 and provided to the adders 13-1 and 13-2, respectively. The distortion compensation data are such one for canceling the detected distortion components. The distortion compensation data, which are predetermined for the distortion components produced by a power amplifier at respective frequency bands, are stored in the lookup tables 17-1 and 17-2.

The adders 13-1 and 13-2 add the distortion compensation data $D_1$ and $D_2$ to signals to be transmitted in frequency bands to perform distortion compensation (addition of predistortion). Since the distortion compensation is carried out for each frequency band, it is possible to achieve highly accurate distortion compensation in the plural frequency bands.

The transmitting signals added with distortion compensation data at the adders 13-1 and 13-2 are combined with each other at the combiner 14, and the combined output is power-amplified by a power amplifier (not shown) or converted into a radio signal, and then amplified by a power amplifier and transmitted.

When the lookup table type predistorter according to the present invention is applied to mobile communication, frequency band signals extracted by the variable band signal extractors 11-1 and 11-2 are those in the 800 MHz band and the 1.5 GHz band, for example. The number of the frequency bands is not limited to two. If signals in the 2 GHz band and the 5 GHz band are also to be transmitted simultaneously, the number of the input side variable band signal extractors is four, and the numbers of the dividers, adders, difference detectors, lookup tables and output side variable band signal extractors are each four, too.

Figure 2:
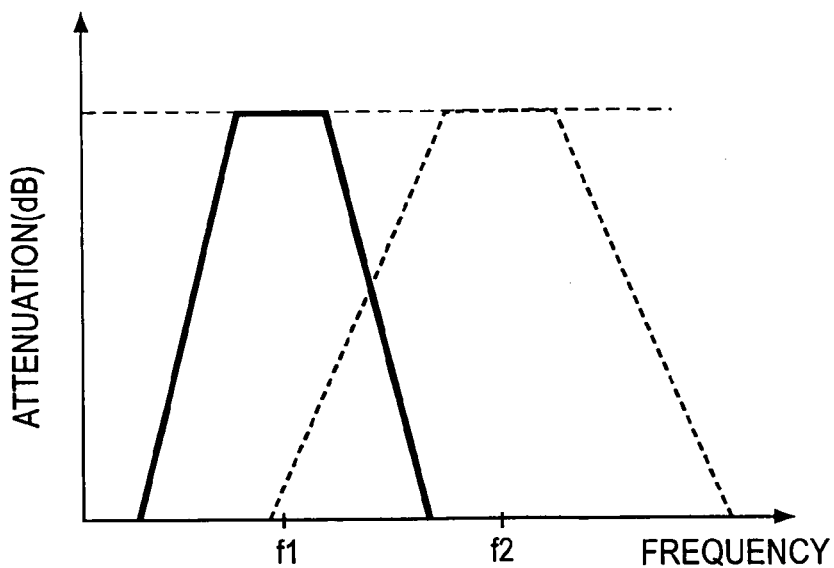
FIG. 2 is a diagram showing an example of frequency versus attenuating characteristics when a variable band signal extractor consists of variable band-pass filter.

Characteristics of the variable band signal extractors 11-1 and 11-2 and the variable band signal extractors 15-1 and 15-2 can be materialized by band-pass filters, for example, with desired frequency bands and center frequencies of f1 and f2, respectively. FIG. 2 schematically shows frequency versus attenuating characteristics of the variable band signal extractors 11-1 and 11-2 in a solid line and a dashed line, respectively, in the case each of the extractors is constructed of a variable band-pass filter. The horizontal axis indicates frequency and the vertical axis indicates attenuation (dB). The characteristics need to be that attenuation steeply increases outside the frequency bands of the center frequencies of f1 and f2, respectively, and a frequency difference between frequency bands is sufficiently large. Such characteristics can be usually obtained by connecting a plurality of band-pass filters in cascade. This is true for the variable band signal extractors 15-1 and 15-2.

Figure 3:
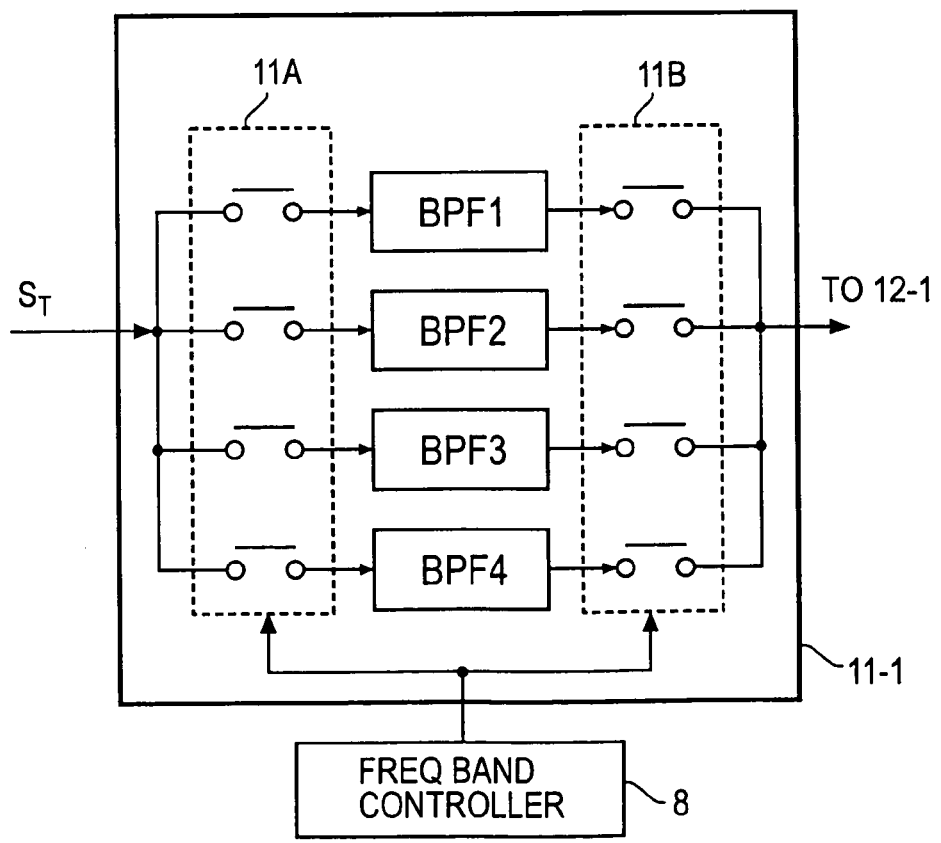
FIG. 3 is a diagram showing an example of a filter bank constructed of four filters.

In the case where a filter is constructed of a microstrip line, for example, a center frequency can be made variable by switching the length of a resonator with such a switch as diode or MEMS switch. Whereas, the bandwidth of each of the variable band signal extractors 11-1, 11-2, 15-1 and 15-2 can be changed by switching a bank of the filters of different center frequencies. FIG. 3 shows an example of the variable band signal extractor 11-1 consisting of a bank of four band-pass filters.

An input transmitting signal $S_T$ which can be in any one of a plurality of frequency bands is inputted from the divider 10 (FIG. 1) to a single-pole terminal of a single-pole four-throw switch 11A. One end of each of the band-pass filters BPF1 to BPF4 is connected to corresponding one of four throw terminals of the single-pole four-throw switch 11A. The other end of each of the band-pass filters BPF1 to BPF4 is connected to corresponding one of four throw terminals of a single-pole four-throw switch 11B. A single terminal of the single-pole four-throw switch 11B is connected to the divider 12-1 (FIG. 1).

Figure 4A:
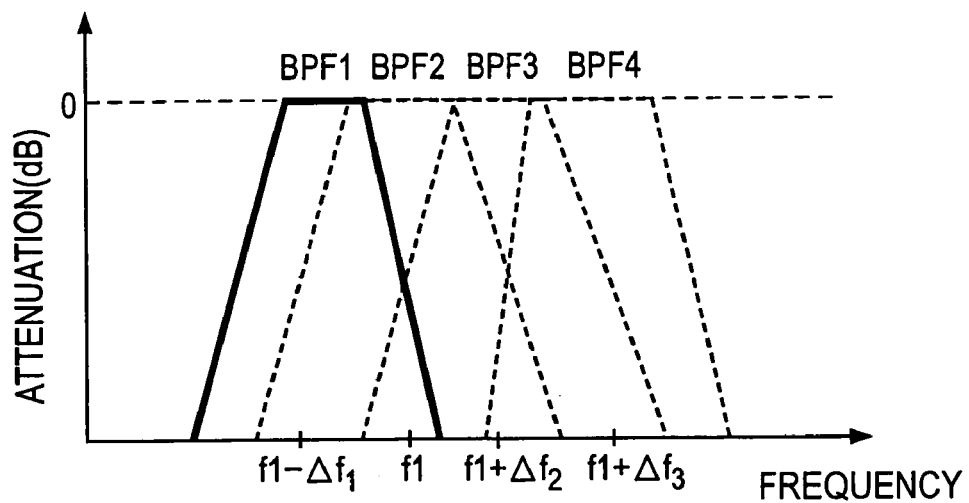
FIG. 4A is a diagram showing an example of a frequency versus attenuating characteristics when a variable band signal extractor consists of a plurality of band-pass filters with different center frequencies.

Conduction/non-conduction of each contact of single-pole four-throw switches 11A and 11B is controlled by a common control signal from the band controller 8. Supposing that the center frequency of BPF2 is f1, the center frequency of BPF1 is f1−Δf$_1$, the center frequency of BPF3 is f1+Δf$_2$, and the center frequency of BPF4 is f1+Δf$_3$, as shown in FIG. 4A. By adjoining frequency bands of a bank of filters one another and making desired one or more of the filters selectable, it is possible to compose a variable band signal extractor whose center frequency and the pass-bandwidth are variable.

Figure 4B:
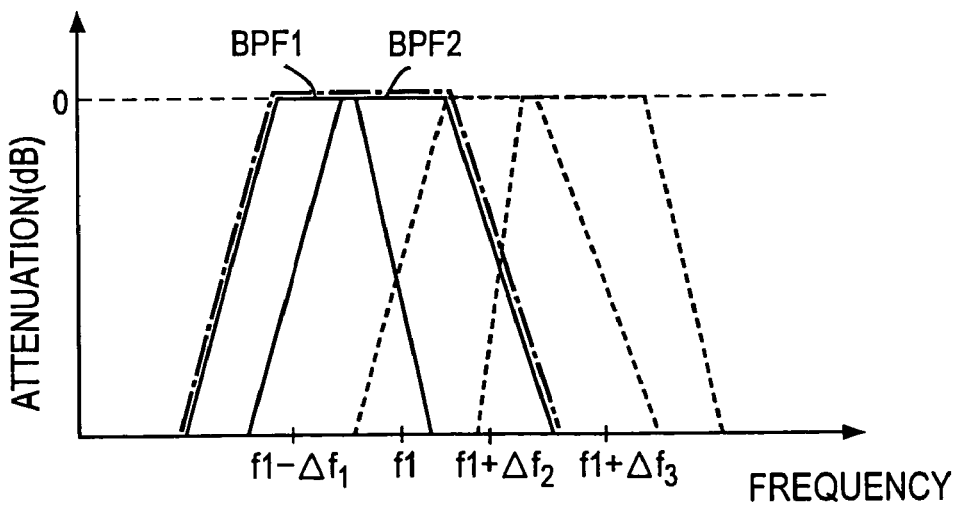
FIG. 4B is a diagram showing an example of another frequency versus attenuating characteristics.

A bold line in FIG. 4A, for example, shows a case where only a band-pass filter BPF1 is selectively operated by single-pole four-throw switches 11A and 11B based on the control signal from the frequency band controller 8. In FIG. 4B, a bandwidth and a center frequency are changed as indicated by a chain line when both of BPF1 and BPF2 are selectively operated at the same time. The variable band signal extractor that makes pass-bandwidth variable can be configured by using a bank of filters in this way.

The frequency band controller 8 controls the variable band signal extractor by control signals from an operation center or the like. Alternatively, as shown by a dashed line in FIG. 1, the frequency band controller 8 may detect a center frequency and a bandwidth of each frequency band from the input transmitting signal supplied from a divider 9 that is provided on the signal input side, and automatically control the variable band signal extractors 11-1, 11-2, 15-1, and 15-2 based on the detected center frequency and bandwidth. That will be described in detail later.

SECOND EMBODIMENT

Figure 5:
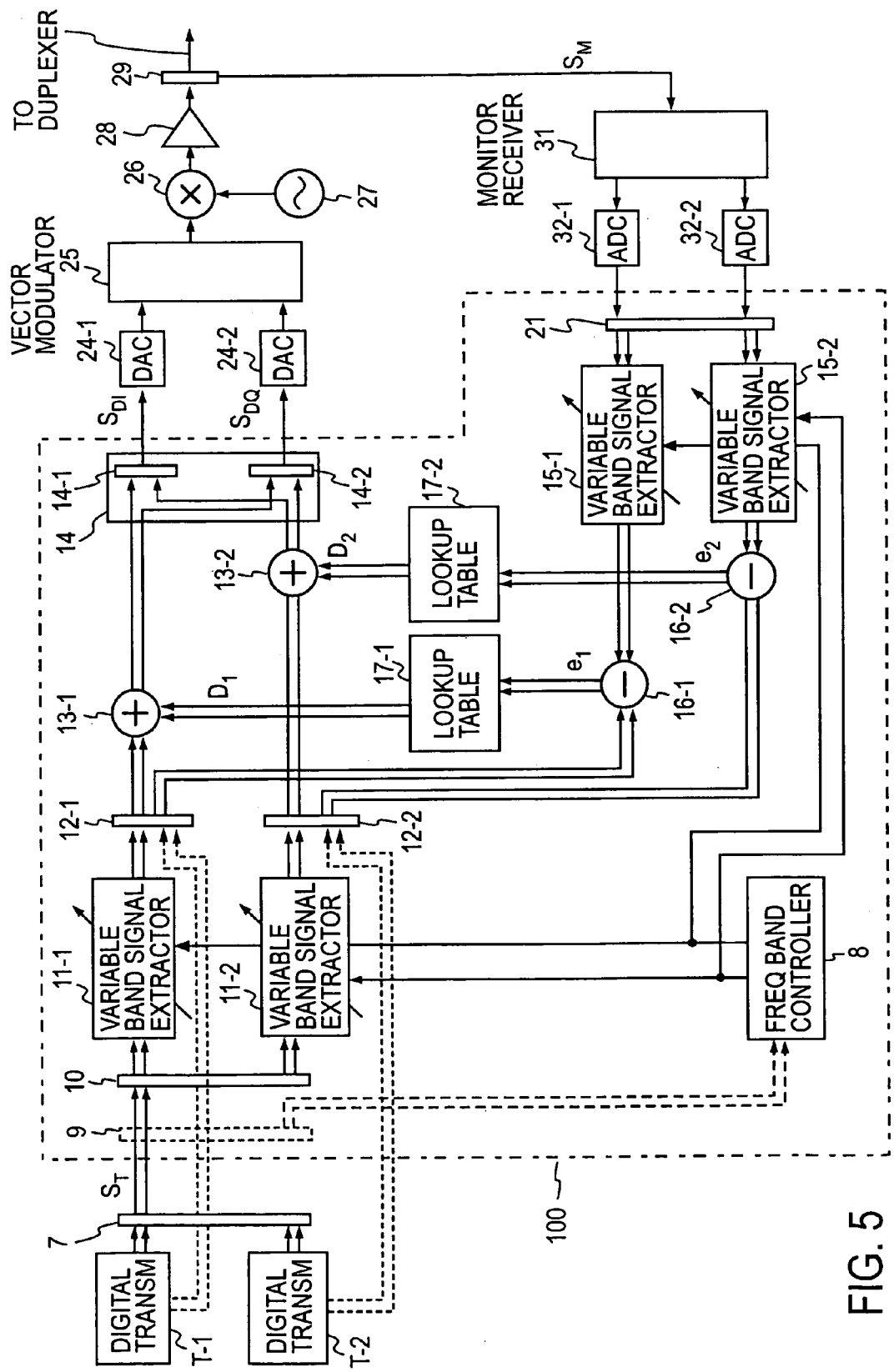
FIG. 5 is a diagram showing the second embodiment of the present invention.

FIG. 5 shows the second embodiment of the present invention. The second embodiment shows a case where a lookup table type predistorter 100 in a dotted box is constructed of a digital circuit. In the embodiment, each signal line consists of two paths for the I signal and the Q signal. Digital base band signals in different frequency bands from digital transmitters T-1 and T-2 of dual frequency bands are combined at the combiner 7 and inputted to the divider 10 of the predistorter 100 as a transmitting signal $S_T$. The divider 10 distributes the transmitting signal $S_T$ to two variable band signal extractors 11-1 and 11-2. The divider 10 in a digital circuit may be merely a "wired OR circuit".

The frequency bands to be extracted by the variable band signal extractors 11-1 and 11-2 are determined based on control signals from the frequency band controller 8 as mentioned above.

Since the basic configuration of the lookup table type digital predistorter 100 is the same as that described in FIG. 1, the same reference numerals as those in FIG. 1 are given to the corresponding parts and redundant description will be avoided. In this embodiment, the combiner 14 consists of an I signal combiner 14-1 for combining I signals from the adders 13-1 and 13-2 and outputting the combined signal as a predistorted transmitting signal $S_{D1}$, and a Q signal combiner 14-2 for combining Q signals from the adders 13-1 and 13-2 and outputting the combined signal as a predistorted transmitting signal $S_{DQ}$. The signals $S_{D1}$ and $S_{DQ}$ combined at the combiner 14 are converted into analog signals at the digital-to-analog converter (DACs) 24-1 and 24-2, respectively, and provided to a vector modulator 25. The vector modulator 25 produces vector modulated signals based on the two analog signals and provides the vector modulated signals to a frequency converter 26. The vector modulated signal is frequency-converted into a transmission signal of a radio frequency band by a carrier signal from a local oscillator 27 and power amplified at the power amplifier 28 and supplied to an antenna (not shown) via a duplexer (not shown).

A directional coupler 29 is provided at the output side of the power amplifier 28. The directional coupler 29 branches a part of the transmitting signal as a monitor signal $S_M$. The signal $S_M$ is demodulated at a monitor receiver 31 to obtain analog I signal and analog Q signal, which are converted into a digital I signal and a digital Q signal by analog-to-digital converters (ADCs) 32-1 and 32-2. The digital I signal and the digital Q signal are divided to the variable band signal extractors 15-1 and 15-2 by the divider 21 in the predistorter 100, and an I signal and a Q signal in the respective frequency bands are extracted. Differences between the I signal and the Q signal in the frequency bands and the I signal and the Q signal in the corresponding frequency bands from the dividers 12-1 and 12-2 are taken at the difference detectors 16-1 and 16-2 to produce difference signals $e_1$ and $e_2$. The difference signals $e_1$ and $e_2$ are used as reference signals for reading compensation data $D_1$ and $D_2$ from the lookup tables 17-1 and 17-2.

With the configuration mentioned above, predistortion linearization is previously produced at the multi-band lookup table type digital predistorter and added to the transmitting signal so that the predistorter cancels intermodulation distortion components produced by non-linear characteristics of the power amplifier 28 when a transmitting signal is amplified at the power amplifier 28. Accordingly, it is possible to compensate for distortion components generated in the amplification by the power amplifier.

Input/output characteristics of the power amplifier 28 may be measured and in each frequency in advance and written as the distortion compensation data in the lookup tables 17-1 and 17-2, or a default value may be written and updated so as to lessen absolute values of difference signals $e_1$ and $e_2$. Since the intermodulation distortion components produced at the power amplifier 28 by input signals in a plurality of frequency bands has frequency intervals wide enough compared to a bandwidth of each frequency band of the power amplifier 28, a duplexer or a band-pass filter at the output side of the power amplifier 28 can easily remove the intermodulation distortion components.

Also in the embodiment in FIG. 5, the frequency band controller 8 may automatically control the variable band signal extractors 11-1, 11-2, 15-1 and 15-2 based on the input digital transmitting signal $S_T$ provided from the divider 9 as shown in dashed lines. A specific configuration of the frequency band controller 8 for such a case will be described later.

THIRD EMBODIMENT

Figure 6:
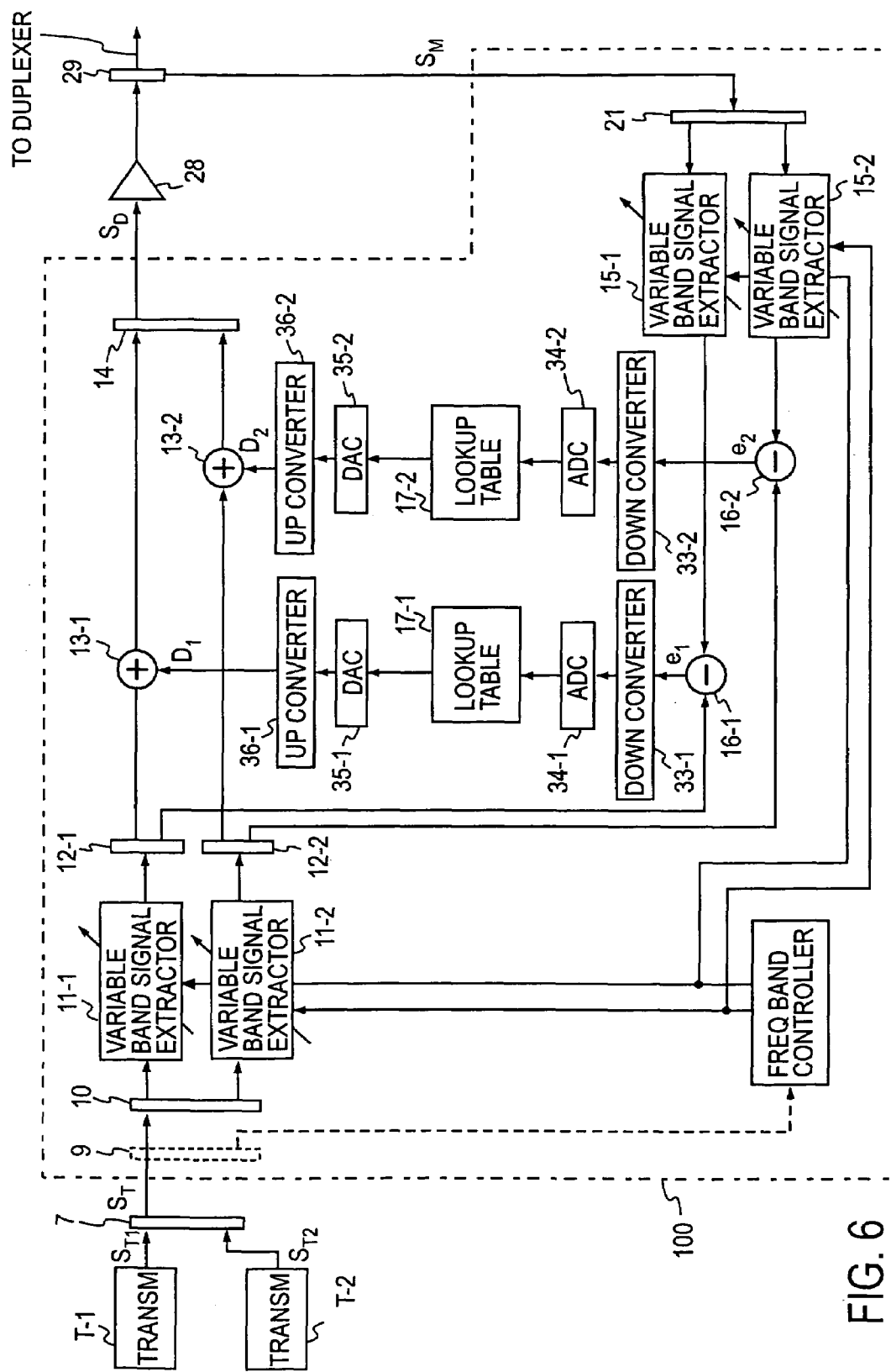
FIG. 6 is a diagram showing the third embodiment of the present invention.

FIG. 6 shows the third embodiment where the present invention is configured by an analog circuit. Since the lookup tables 17-1 and 17-2 are implemented through digital signal processing, the reference signals $e_1$ and $e_2$ are converted from high frequency signals to base band signals by down-converters 33-1 and 33-2 and then converted to digital signals at the ADCs 34-1 and 34-2. The distortion compensation data $D_1$ and $D_2$ read out from the lookup tables 17-1 and 17-2 are converted into analog signals at the DACs 35-1 and 35-2, further converted into high frequency signals at the up-converters 36-1 and 36-2 and provided to the adders 13-1 and 13-2. The arrangements other than the distortion compensation data $D_1$ and $D_2$ are basically the same as those shown in FIG. 1. Here, an output from the predistorter 100 is power amplified at the power amplifier 28 and the power amplified output is provided to a duplexer (not shown) connected to an antenna (not shown). A directional coupler 29 is provided at an output side of the power amplifier 28. A part of the transmitting signal is branched as a monitor signal $S_M$ at the directional coupler 29 and provided to a divider 21 in the analog predistorter 100, where the monitor signal $S_M$ is provided to the variable band signal extractors 15-1 and 15-2, and respective frequency bands are detected.

As such, the present invention can also consist of an analog circuit.

FOURTH EMBODIMENT

Figure 7:
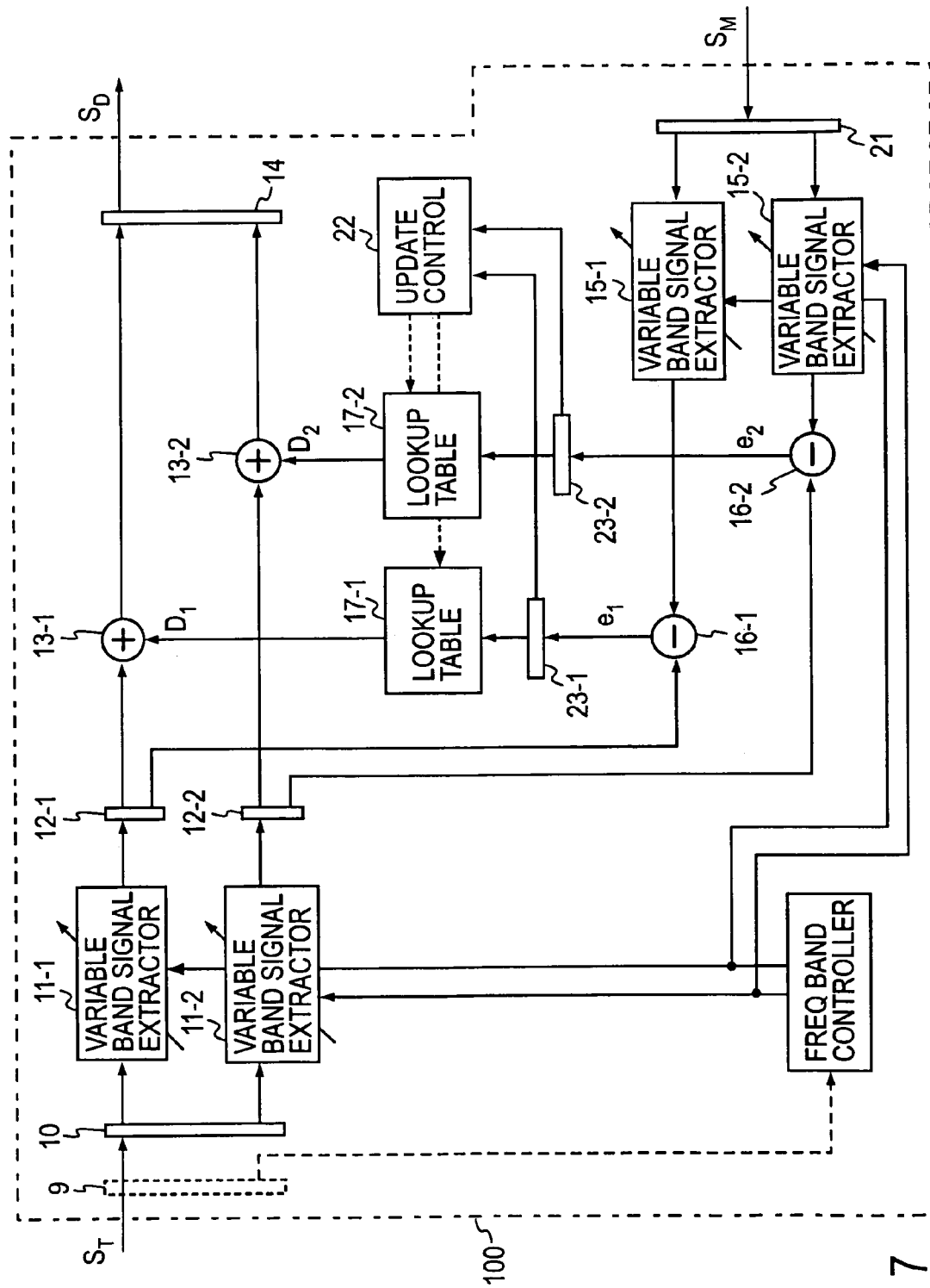
FIG. 7 is a diagram showing the fourth embodiment of the present invention.

FIG. 7 shows the fourth embodiment of the present invention. The embodiment is such one obtained by adding updating functions of the lookup tables 17-1 and 17-2 to the embodiment shown in FIG. 1. In this embodiment, the dividers 23-1 and 23-2 are inserted at the output sides of the difference detectors 16-1 and 16-2 to provide divided difference signals $e_1$ and $e_2$ to an update controller 22, and the lookup tables 17-1 and 17-2 are updated based on the difference signals.

The update controller 22 controls updating of coefficients, which are compensation data in the lookup tables 17-1 and 17-2, so as to minimize absolute values of difference signals $e_1$ and $e_2$.

As the first updating method, in the predistorter 100 for executing distortion compensation on N frequency bands at the same time, the updating of the lookup table by the update controller 22 is controlled by expressions below, where a reference signal of the $i^{th}$ frequency band at time t is represented by $e_i(t)$, a coefficient matrix of the $i^{th}$ frequency band lookup table 17-i is represented by $w_i(t)$.

$$W(t)=(w_1(t) \ldots w_N(t)) \quad (1)$$

$$E(t)=(e_1(t) \ldots e_N(t)) \quad (2)$$

$$W(t+1)=W(t)+\mu(t)E(t) \quad (3),$$

where $\mu(t)$ is a forgetting coefficient matrix represented by the expression below.

$$\mu(t)=(\mu_1(t) \ldots \mu_N(t)) \quad (4)$$

Each forgetting coefficient is a predetermined value less than 0 and larger than −1. The equation (3) is an updating algorithm stored in the update controller 22. The update controller 22 updates coefficients of the lookup table so as to minimize an absolute value of the reference signal matrix E(t). That is to say, in this example, the update controller 22 minimizes the absolute value of the reference signal matrix E(t) by updating coefficients of all the lookup tables instead of minimizing the reference signal $e_i(t)$ by updating a coefficient of each frequency band lookup table 17-i. The forgetting coefficient matrix is obtained under the condition of minimizing an absolute value of the reference signal matrix. That enables distortion compensation of N frequency bands to be executed at the same time. The equation (3) does not update a coefficient of each lookup table.

As the second updating method, a controlling method for minimizing reference signals inputted in each frequency band lookup table. The controller 22 sets a forgetting coefficient $\mu(t)$ to a fixed value $\mu$ as shown in the equation (5) below.

$$W(t+1)=W(t)+\mu E(t) \quad (5)$$

According to the equation (5), a coefficient of each frequency band lookup table is independently controlled so as to minimize each reference signal. The equation (5) may update coefficients of a plurality of lookup tables at the same time. Similarly, the equation (5) may be updated in order. In such a case, the number of coefficients of the lookup table to be controlled at the same time is 1.

FIFTH EMBODIMENT

Figure 8:
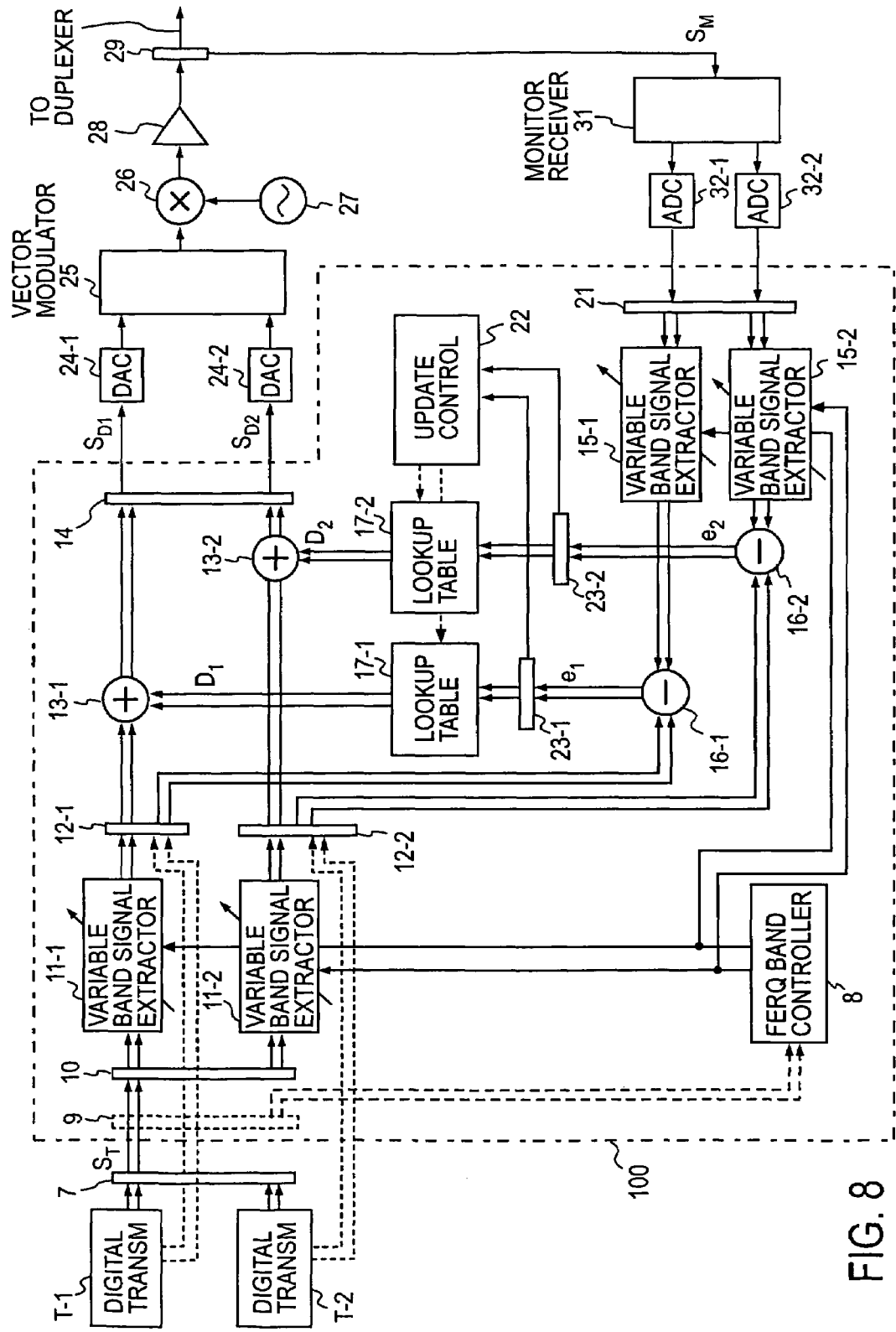
FIG. 8 is a diagram showing the fifth embodiment of the present invention.

FIG. 8 shows the fifth embodiment. The fifth embodiment is such one obtainable by adding updating functions of the lookup tables 17-1 and 17-2 to the embodiment shown in FIG. 5. In this embodiment, dividers 23-1 and 23-2 and an update controller 22 are added as in the case of the embodiment shown in FIG. 7.

In this embodiment, a part of the output from the power amplifier 28 is branched as a monitor signal $S_M$ from a directional coupler 29, and the monitor signals $S_M$ is down-converted at a monitor receiver 31 to produce baseband signals, which are converted to digital baseband signals by the ADCs 32-1 and 32-2. The difference detectors 16-1 and 16-2 obtain the differences between digital baseband signals and signals provided by the dividers 12-1 and 12-2 as reference signals $e_1$ and $e_2$. The update controller 22 updates coefficients of the lookup tables 17-1 and 17-2 by control signals based on the reference signals $e_1$ and $e_2$ and also read distortion compensation data from the lookup tables 17-1 and 17-2. This series of signal processing is performed for each transmission frequency band. In this manner, it is possible to perform distortion compensation on the transmitting signals of a plurality of frequency bands, independently.

The update controller 22 instructs two lookup tables 17-1 and 17-2 to update coefficients so as to minimize the sum of absolute values of the reference signals $e_1$ and $e_2$ in dual frequency bands. Alternatively, an instruction to each of the lookup tables 17-1 and 17-2 to update coefficients may be done with a coefficient that minimizes an absolute value of each of the reference signals $e_1$ and $e_2$.

Initial coefficients of lookup tables 17-1 and 17-2 are obtained previously by measuring input/output characteristics of the power amplifier 28 for each frequency band. The update of coefficients in the frequency bands lookup tables 17-1 and 17-2 for each frequency band is repeated until a predetermined distortion suppression amount is reached for each frequency band. By repeating the process, it is possible to adaptively improve distortion suppression amount for each frequency band.

SIXTH EMBODIMENT

Figure 9:
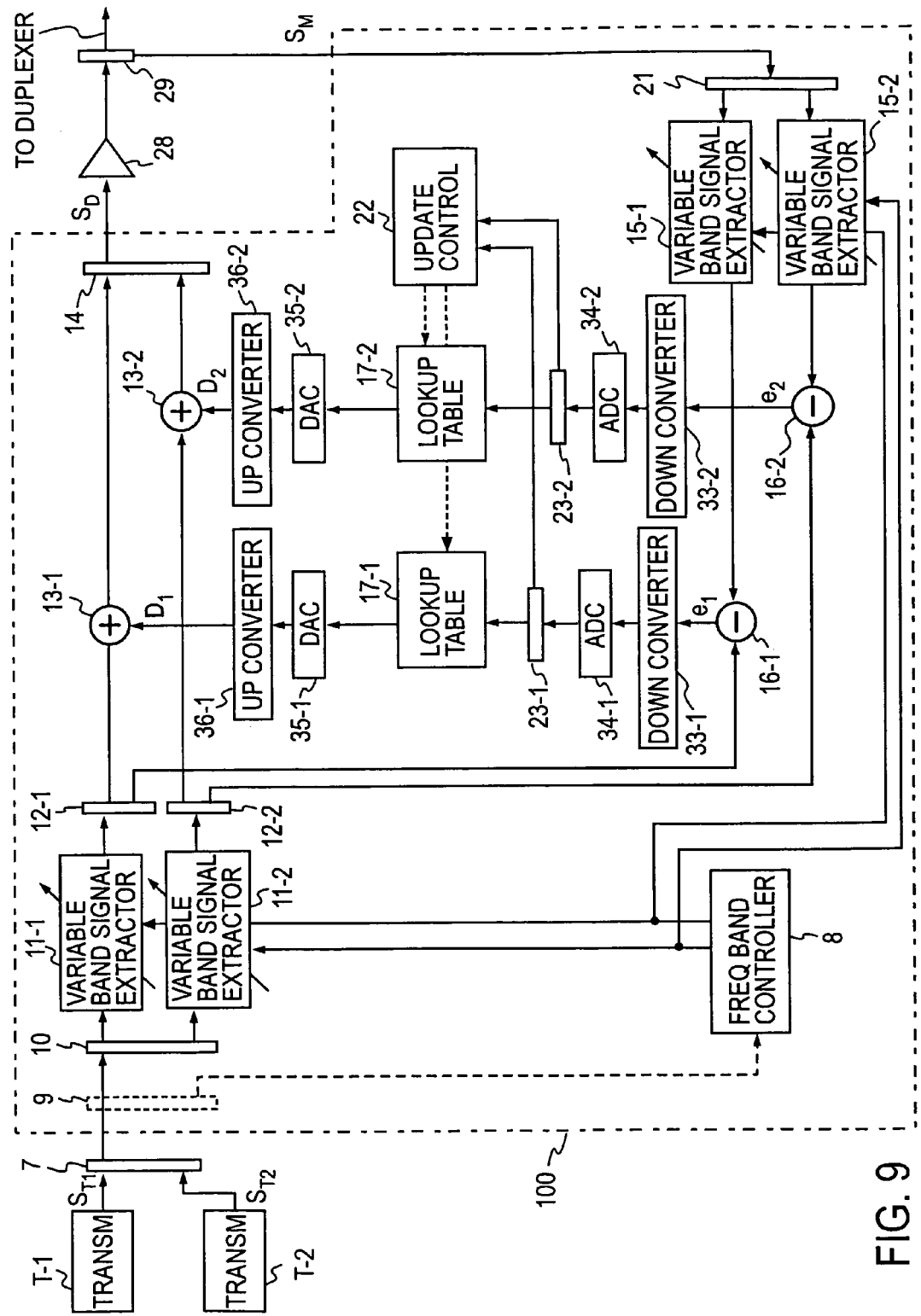
FIG. 9 is a diagram showing the sixth embodiment of the present invention.

FIG. 9 shows the sixth embodiment. The sixth embodiment is such one obtained by adding updating functions of the lookup tables 17-1 and 17-2 to the embodiment of the analog distorter shown in FIG. 6. In this embodiment, the dividers 23-1 and 23-2 and an update controller 22 are provided as in the embodiment shown in FIG. 7. Update operation of the lookup tables 17-1 and 17-2 by the update controller 22 is the same as that shown in FIG. 8, therefore, the description for the operation will be omitted.

SEVENTH EMBODIMENT

The variable band signal extractors 11-1, 11-2, 15-1 and 15-2 have been described only in examples consisting of band-pass filters as shown in FIGS. 2 and 4. Such a variable band signal extractor constructed of band-pass filters has an advantage that the peripheral frequency band around the center frequency can be easily extracted and that isolation from the center frequency can be attained relatively easily. However, because the center frequency is a resonant frequency of a band-pass filter, the signals delay becomes longer.

As a result, a delay of each frequency band signals extracted from the monitor signals by the variable band signal extractors 15-1 and 15-2 relative to the difference signals from the dividers 12-1 and 12-2 provided to the difference detectors 16-1 and 16-2 becomes longer, causing a problem that the length of lines from the dividers 12-1 and 12-2 to the difference detectors 16-1 and 16-2 needs to be longer according to the delayed amount and that an attenuation of signals increases. Then, it is considered that each of BPF1 to BPF4 of the variable band signal extractor shown in FIG. 3 can be constructed of band elimination filters (hereinafter, may be referred to as BEFs). If each BPF is constructed of band elimination filters, a frequency band to be extracted is not on the center frequency of the band elimination filters, so that the amount of delay of the frequency band signal caused by the BEFs is considerably small. Therefore, the embodiment is advantageous in that it can make the length of delay lines from the dividers 12-1 and 12-2 to the difference detectors 16-1 and 16-2 shorter and achieve low-loss. Further, band elimination filters can be designed easily.

Figure 10:
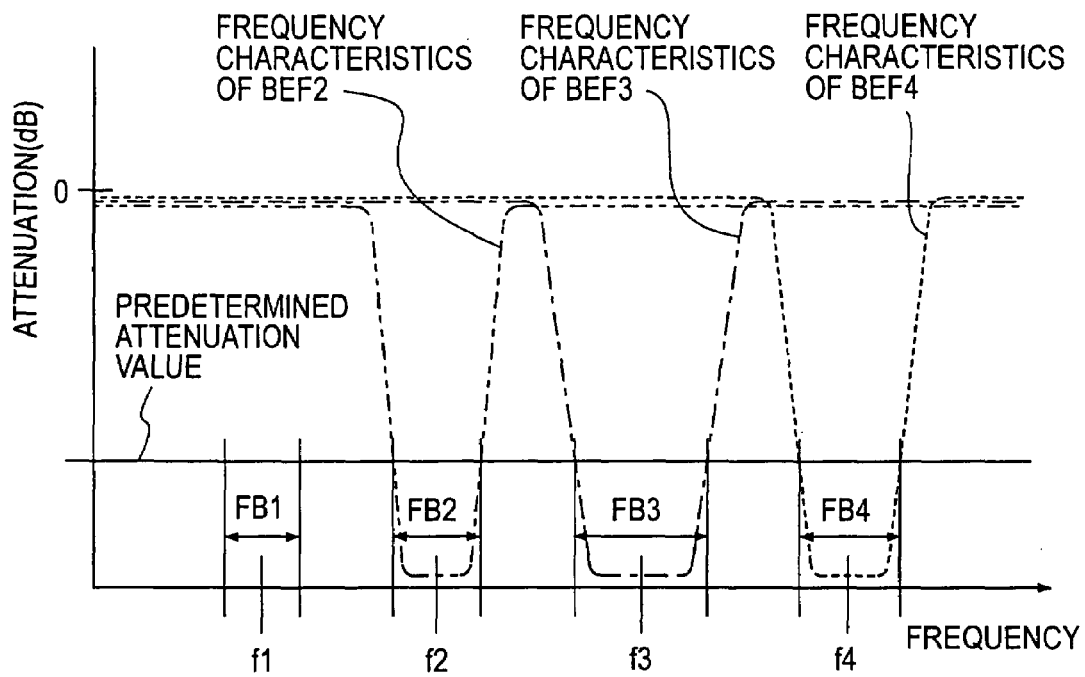
FIG. 10 is a diagram showing a frequency versus attenuating characteristics of a band elimination filter.
Figure 11:
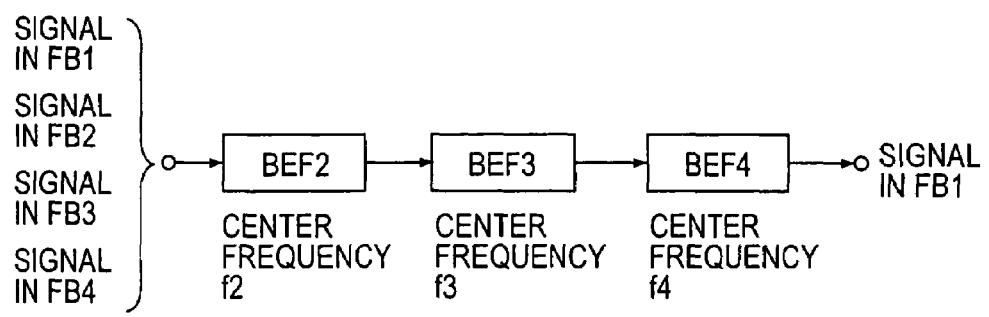
FIG. 11 is a diagram showing an example of extracting a frequency band from four frequency bands by using band elimination filters.

FIGS. 10 and 11 show examples of extracting a frequency band from, for example, four frequency bands by a combination of a plurality of band elimination filters. FIG. 10 shows frequency versus attenuation characteristics. Explanation will be given of BEF3 shown by a chain line for an example. Elimination center frequency of BEF3 is f3. The attenuation of a certain bandwidth centering on f3 is large. FIG. 11 shows an example of extracting a frequency band by connecting three band elimination filters in cascade.

In the case of extracting a signal in the frequency band FB1, three filters of BEF2 whose elimination center frequency is f2, BEF3 whose elimination center frequency is f3, and BEF4 whose elimination center frequency is f4 are connected in cascade as shown in FIG. 11, allowing passage there through of a signal in the frequency band FB1. Similarly, in the case of extracting a signal in the frequency band FB2, it is only needed to serially connect band elimination filters (not shown) whose elimination frequency bands are f1, f3 and f4. It is also possible to construct such that N−1 band elimination filters are serially connected to form each of BPF1 to BPF4 illustrated in FIG. 3.

EIGHTH EMBODIMENT

Figure 12:
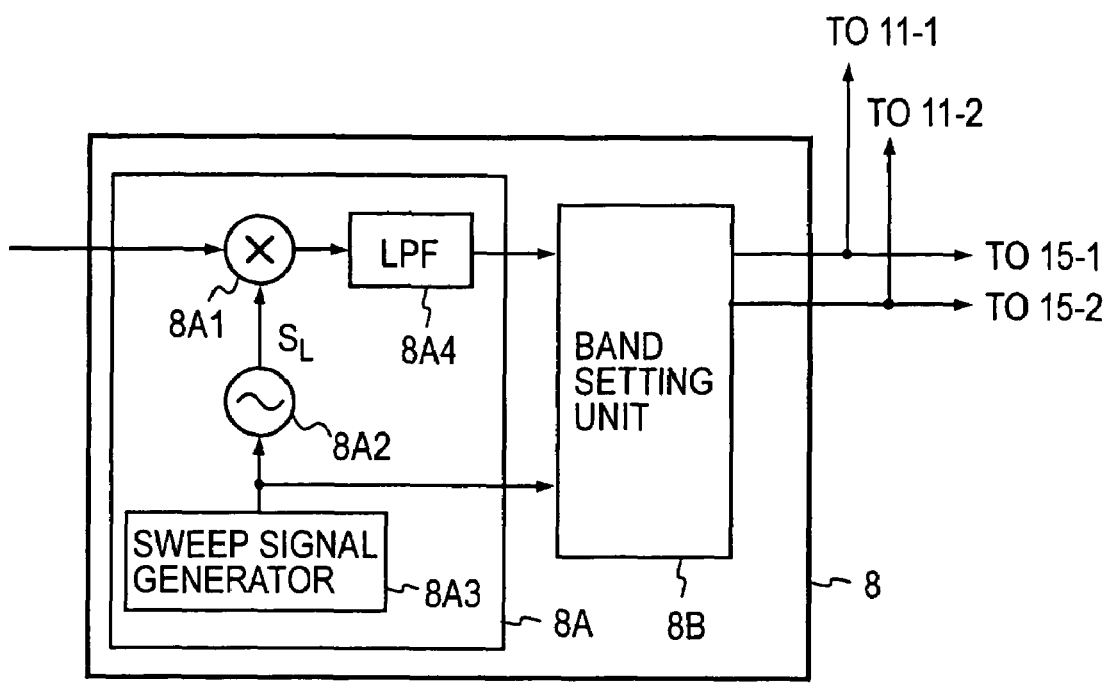
FIG. 12 is a diagram showing a configuration of a frequency band controller for executing automatic control.

FIG. 12 shows an exemplary configuration of a frequency band controller 8 for automatically controlling the variable band signal extractors 11-1, 11-2, 15-1 and 15-2 in the embodiment of each analog predistorter shown in FIGS. 1, 6, 7 and 9. The frequency band controller 8 of the embodiment consists of a frequency band detector 8A and a frequency band setting unit 8B. The frequency band detector 8A consists of a mixer 8A1, a local oscillator 8A2, a sweep signal generator 8A3 and a low-pass filter (referred to as an LPF) 8A4.

Figure 13A:
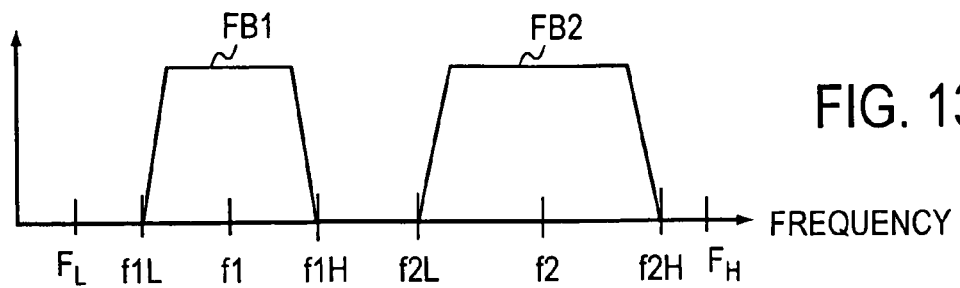
FIG. 13A is a schematic diagram showing an example of a spectrum of an input signal.
Figure 13B:
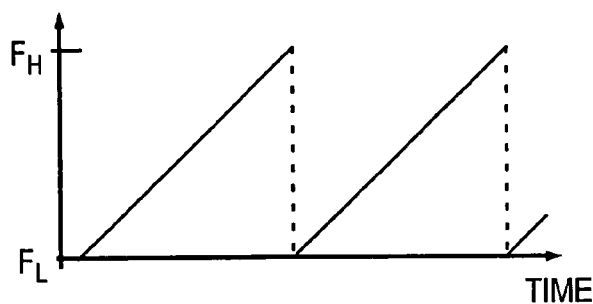
FIG. 13B is a diagram for illustrating a frequency sweep.

The input transmitting signal $S_T$ of the predistorter 100 is branched to the mixer 8A1 of the band controller 8 by the divider 9 of each of the abovementioned embodiments. The transmitting signal $S_T$ is assumed to include signals in dual frequency bands FB1 and FB2 whose center frequencies are f1 and f2 as shown in FIG. 13A, for example. The lower limit frequency of the frequency band FB1 is f1L and the upper limit frequency is f1H. The lower limit frequency of the frequency band FB2 is f2L and the upper limit frequency is f2H. The local oscillator 8A2 is a voltage controlled oscillator, for example, and generates a local oscillation signal $S_L$ whose frequency is swept by a sweep signal $V_S$ from the sweep signal generator 8A3, whose voltage changes in a shape. The frequency sweep keeps repeatedly sweeping in succession from a predetermined lower limit sweep frequency $F_L$ lower than the two frequency bands FB1 and FB2 shown in FIG. 13A to a predetermined upper limit sweep frequency $F_H$ higher than the two frequency bands, for example (see FIG. 13B).

Figure 13C:
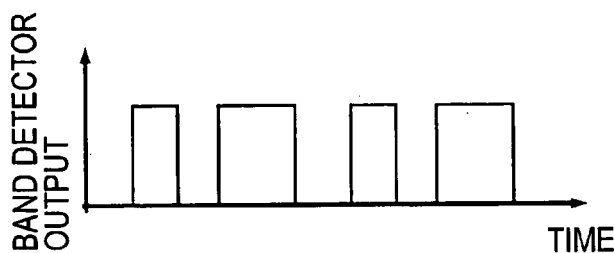
FIG. 13C is a diagram showing an example of detection output by a frequency band detector.
Figure 13D:
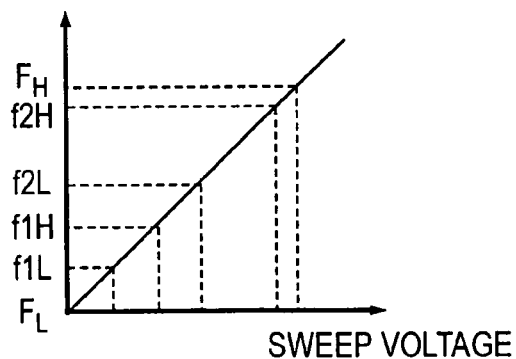
FIG. 13D is a diagram showing relationship between a sweep voltage and a sweep frequency.

The mixer 8A1 multiplies the local signal $S_L$ from the local oscillator 8A2 by the input signal $S_T$. The components around a direct current are extracted by LPF 8A4 from the output of the mixer 8A 1 and provides the direct current components to the frequency band setting unit 8B as an output from the band detector 8A. The direct current components are outputted from the LPF 8A4 during intervals where the frequency components of the input signal $S_T$ and a sweep frequency of the local oscillation signal $S_L$ match, as shown in FIG. 13C. Relationship between the sweep signal voltage $V_S$ and the sweep frequency is previously measured as shown in FIG. 13D. The band setting unit 8B detects the lower limit frequency f1L and the upper limit frequency f1H of the frequency band FB1 and the lower limit frequency f2L and the upper limit frequency f2H of the frequency band FB2 by using the sweep signal voltage $V_S$ and band detecting signals from the LPF 8A4. The center frequency of each frequency band is obtained by f1=(f1L+f1H)/2 and f2=(f2L+f2H)/2.

Figure 13E:
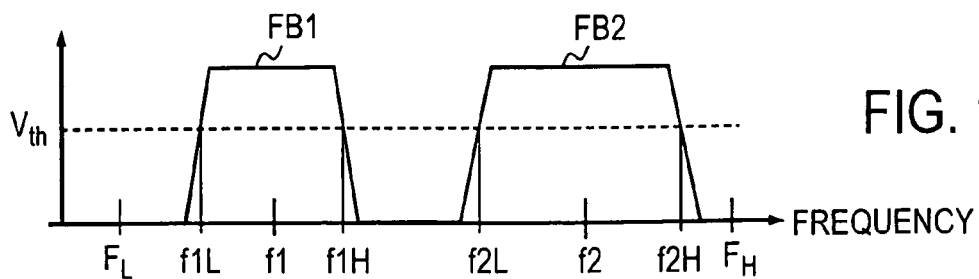
FIG. 13E is a diagram for illustrating frequency band detection by a threshold.

Specifically, the band setting unit 8B determines sweep frequencies at which the threshold $V_{th}$ matches the rise and fall of direct current component voltages outputted from the LPF 8A4 as the local oscillation frequency is swept as shown in FIG. 13E. As it is apparent from FIG. 13E, bandwidths of the frequency bands FB1 and FB2 obtained from f1L, f1H, f2L and f2H that are determined from the threshold are narrower than the actual bandwidths. However, it is possible to accurately determine the lower limit frequencies and the upper limit frequencies by multiplying the detected f1L, f1H, f2L and f2H by a predetermined coefficient, respectively, for example.

The band setting unit 8B sets the center frequency f1, the lower limit frequency f1L and the upper limit frequency f1H of the frequency band FB1 determined in this manner to the variable band signal extractors 11-1 and 15-1, and sets the center frequency f2, the lower limit frequency f2L and the upper limit frequency f2H of the frequency band FB2 to the variable band signal extractors 11-2 and 15-2. For the variable band signal extractors shown in FIG. 3, for example, a set of band-pass filters to be selected from the band-pass filters BPF1 to BPF4 are designated based on the determined center frequency, the lower limit frequency and the upper limit frequency.

If the frequency of the input signal $S_T$ of the lookup table type predistorter 100 is dynamically changed, i.e., if the frequency of the signal inputted into the power amplifier is dynamically changed, the frequency band controller 8 needs to control the variable band signal extractors according to the dynamically changed frequency. The time period for changing the frequency is determined by the frequency sweep time of the local oscillator 8A2. That is to say, the time period is determined by the time for one cycle of frequency sweep. In the example of FIG. 12, the embodiment can increase a detecting speed of the frequency band detector 8A by speeding up the frequency sweep of the local oscillator 8A2. Even if the frequency sweep is speeded up, efficiency of frequency band detection would not be lowered.

The voltage controlled oscillator that can sweep the oscillation frequency may be such one used for a general signal generator. The low-pass filter 8A4 can be realized by an LC filter or an active filter using an operational amplifier. The frequency band setting unit 8B can be realized by an analog digital converter that digitizes direct current components and a microprocessor. Although the frequency band controller 8 shown in FIG. 12 is premised on an analog predistorter, the frequency band controller 8 can also be realized by the same functional configuration with a digital predistorter.

The frequency band information can be obtained from the input signal by using the frequency band controller 8 of FIG. 12 employed in the lookup table type predistorter of a transmitter installed in the mobile communication base station, for example, without needing to obtain information on a frequency band from a modem. Therefore, the lookup table type predistorter can solely set a frequency band for a variable band signal extractor. Accordingly, the embodiment can simplify a control system. In the case where a modulator is installed in a relaying device at a foot of an antenna tower and a power amplifier including the lookup table type predistorter is installed in a device at the top of the tower directly under the antenna that is distant from the relaying device, there is no need to exchange information on an operational frequency between the modulator and the power amplifier. That enables to perform maintenance and adjustment on each device, independently.

NINTH EMBODIMENT

Figure 14:
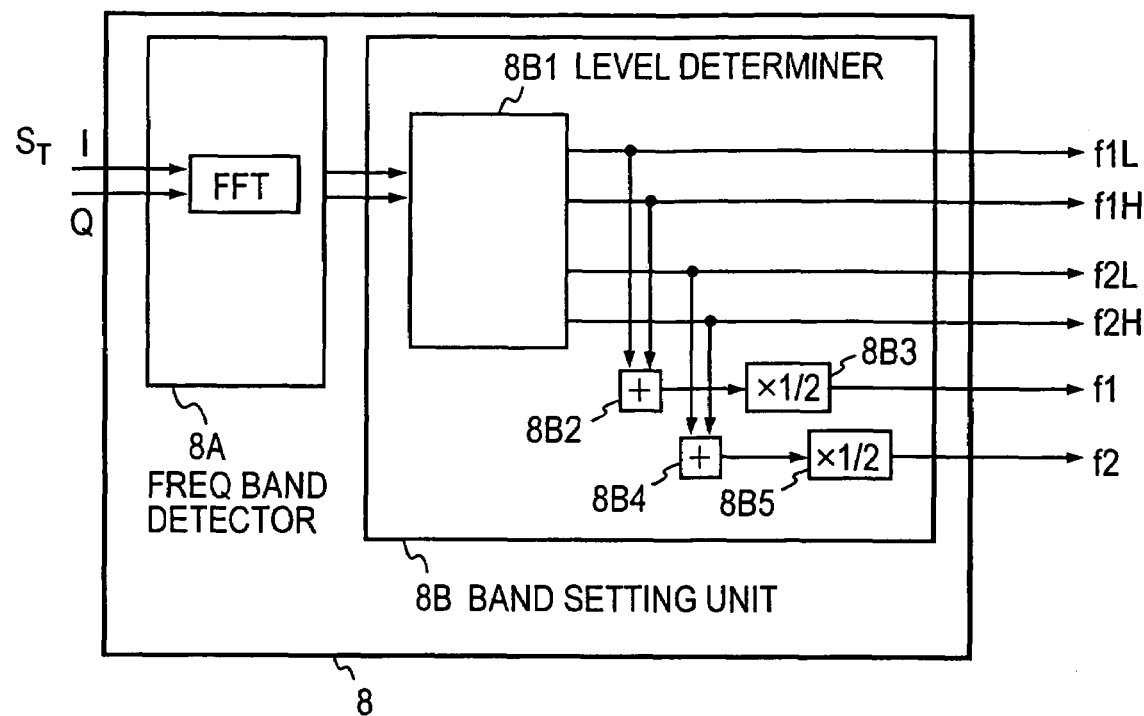
FIG. 14 is a diagram showing a configuration of a frequency band controller corresponding to a digital predistorter.

FIG. 14 shows a configuration of the band controller 8 for automatically controlling the variable band signal extractors 11-1, 11-2, 15-1 and 15-2 in each embodiment of the digital predistorter configuration shown in FIGS. 5 and 8. The band controller 8 of the embodiment detects a transmitting signal frequency band included in the base band input signal $S_T$ (I signal and Q signal) provided from the divider 9.

The frequency band controller 8 consists of the frequency band detector 8A and the band setting unit 8B. The frequency band detector 8A consists of a fast Fourier transform unit (FFT). The band setting unit 8B consists of level determiner 8B1, adders 8B2 and 8B4 and ½ multipliers 8B3 and 8B5.

The frequency components of the input signal $S_T$ are detected by the FFT which converts the input signal $S_T$ divided by the divider 9 from a time domain to a frequency domain. The level determiner 8B1 compares the frequency components detected by the FFT with a threshold $V_{th}$ preset as in the case of FIG. 13E, and detects frequencies at which levels of the frequency components match the threshold as the lower limit frequency f1L and the upper limit frequency f1H of the frequency band FB1 and the lower limit frequency f2L and the upper limit frequency f2H of the frequency band FB2, respectively. The adder 8B2 calculates the sum of f1L and f1H, and the ½ multiplier 8B3 multiplies the sum by ½. The result of the multiplication is determined as a center frequency f1 of the frequency band FB1. Similarly, the adder 8B4 calculates the sum of f2L and f2H, and the ½ multiplier 8B5 multiplies the sum by ½. The result of the multiplication is determined as a center frequency f2 of the frequency band FB2. With f1, f1L, f1H, f2, f2L and f2H determined in this manner, each center frequency and each frequency band of the variable band signal extractors 11-1, 11-2, 15-1 and 15-2 are set.

Commercialized ICs can be used as an FFT. The frequency band detector 8A can be realized by using a DSP (Digital Signal Processor) or an FPGA (Field Programmable Gate Array) instead of the FFT. The level determiner 8B1 can consist of a comparator. The frequency band detector 8A and the band setting unit 8B can be constructed of such simple circuits. It is possible to calculate the lower limit frequency, the upper limit frequency and the center frequency by mathematical operations with a DSP for the band setting unit 8B.

TENTH EMBODIMENT

Figure 15:
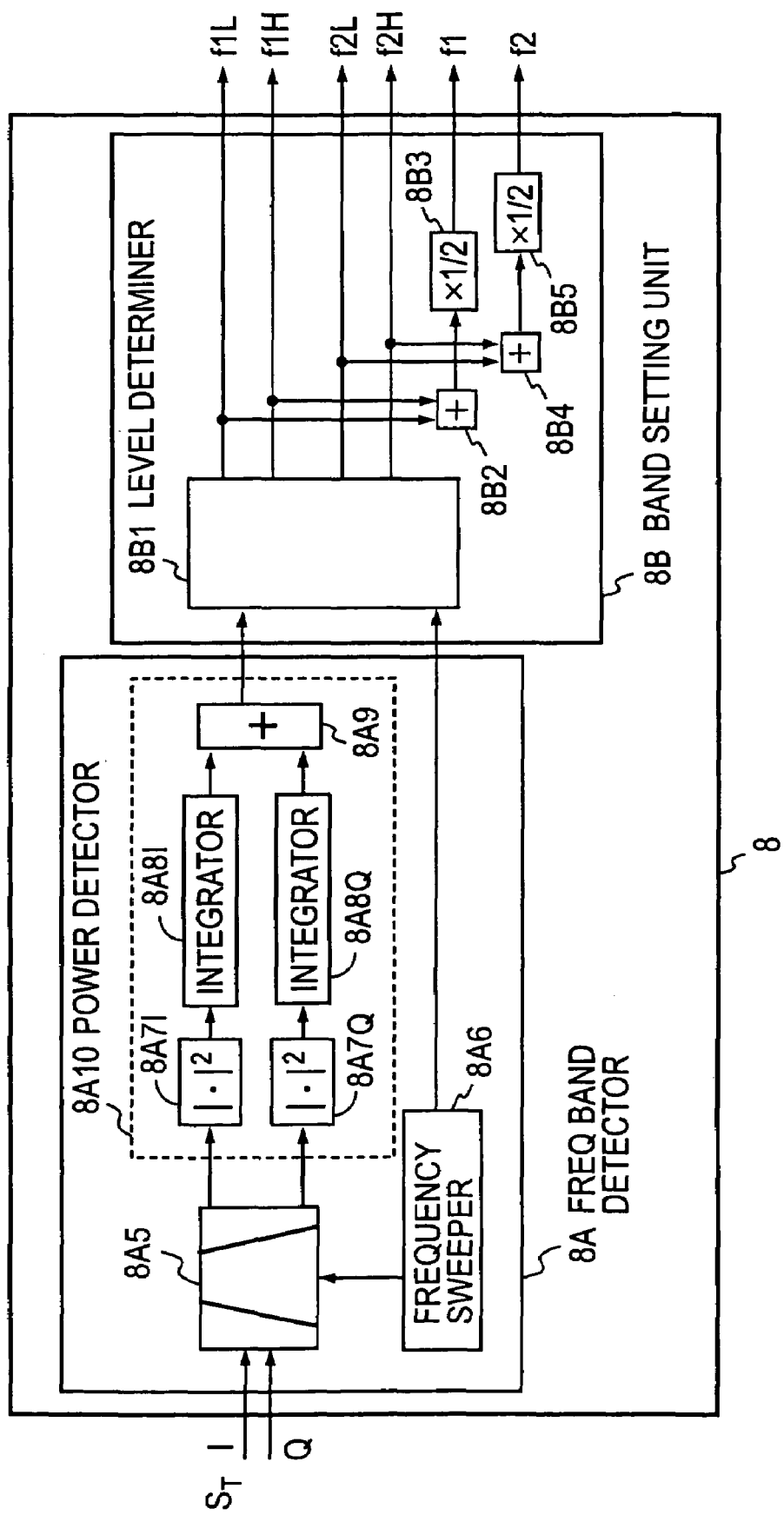
FIG. 15 is a diagram showing another example of a configuration of a frequency band controller.

FIG. 15 shows another example of the frequency band controller 8 in the embodiments shown in FIGS. 5 and 8. In the embodiment, the band detector 8A consists of a variable filter 8A5, a frequency sweeper 8A6, multipliers 8A7I and 8A7Q, integrators 8A8I and 8A8Q, and an adder 8A9. The multipliers 8A7I and 8A7Q, the integrators 8A8I and 8A8Q and the adder 8A9 form a power detector 8A10. The band setting unit 8B consists of a level determiner 8B1, adders 8B2 and 8B4 and ½ multipliers 8B3 and 8B5.

Figure 16A:
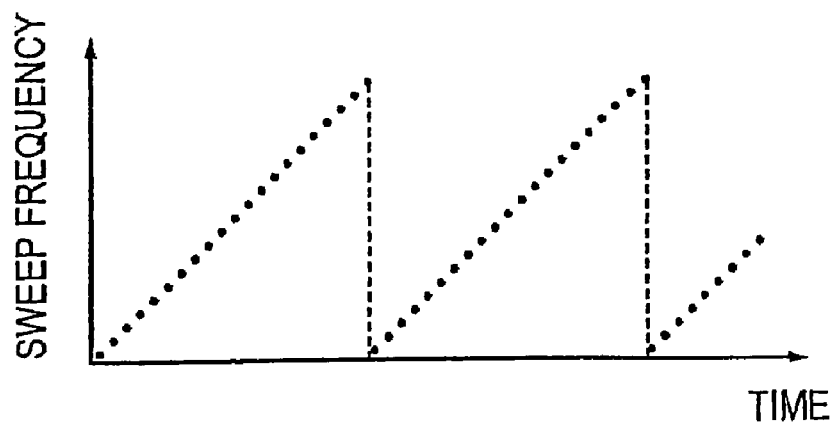
FIG. 16A is a diagram for illustrating a discrete frequency sweep.
Figure 16B:
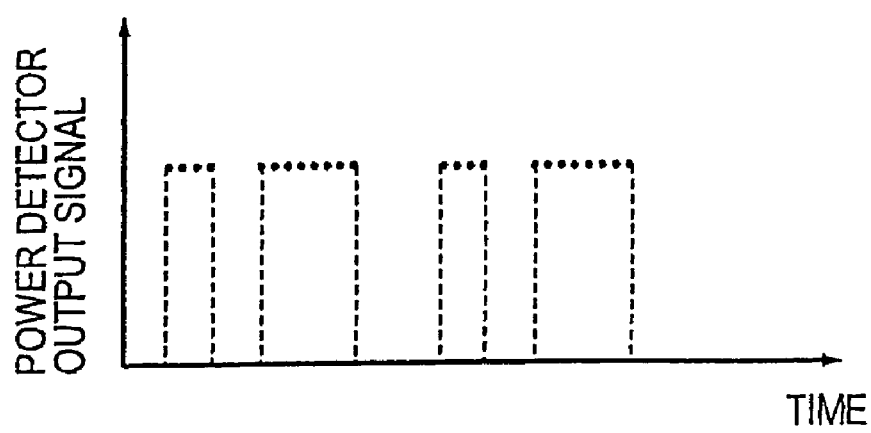
FIG. 16B is a diagram showing an output example of a power detector.

The frequency components in a narrow range of the digital input transmitting signal $S_T$ from the divider 9 are extracted by using the variable filter 8A5. The center frequency of the narrow pass band of the variable filter 8A5 is discretely swept in a sawtooth shape as shown in FIG. 16A by the frequency sweep signal generated in the frequency sweeper 8A6. Outputs from the variable filter 8A5 are the I signal and the Q signal, and their absolute values are squared by the multipliers 8A7I and 8A7Q. In the case where the center frequency of the variable filter 8A5 is fixed, the integrators 8A8I and 8A8Q each calculate a time average of the squared signal at the center frequency. In the case where the center frequency of the variable filter 8A5 is swept, the integrators 8A8I and 8A8Q each calculate a moving average of the squared signal. Either of the method mentioned above is performed to smooth fluctuation of the output of the variable filter 8A5. Outputs from the integrators 8A8I and 8A8Q are added at the adder 8A9. The result of the addition is provided to the level determiner 8B1 as an output from the frequency band detector 8A, as shown in FIG. 16B.

The level determiner 8B1 references a discrete frequency represented by the frequency sweep signals from the frequency sweeper 8A6, and detects the frequencies at which levels of the output from the power determiner 8A 10 are equal to or greater than the preset threshold $V_{th}$ as shown in FIG. 13E, as the lower limit frequencies and the upper limit frequencies of the frequency bands FB1 and FB2 of the signals. In such a case, the embodiment determines that the frequency which is reverse to the result of comparison with the threshold as the lower limit frequency or the upper limit frequency, as the power determiner 8B1 discretely sweeps the frequency.

The variable filter 8A5 of the frequency band detector 8A may be constructed of is a digital filter. The pass-bandwidth and the center frequency are determined by coefficients of the digital filter. The variable filter 8A5 sets the pass-bandwidth and the center frequency by using a previously calculated coefficients list according to the output from the frequency sweeper 8A6. The pass-bandwidth is set so as to be narrow enough in comparison to the bandwidth of the input transmitting signal $S_T$. For example, if a bandwidth of a base band transmitting signal $S_T$ is 15 MHz, the pass-bandwidth of the variable filter 8A5 may be set around 1 kHz. The frequency sweeper 8A6 may be adapted to keep the value of the discrete sweep frequencies of one cycle in a shift register, for example, and output the frequency while cycling the frequencies. Alternatively, the frequency sweeper 8A6 may be adapted to store the values of the discrete sweep frequencies of a cycle in ROM and repeatedly read out a series of frequency values. The integrators 8A8I and 8A8Q may consist of FIR filters, for example. Alternatively, the integrators 8A8I and 8A8Q may be adapted to store data outputted from a multiplier and obtain a simple average.

Although the eighth to tenth embodiments mentioned above describe the case where the input signal $S_T$ of the digital predistorter 100 is divided to the band controller 8 by the divider 9 and frequency bands of the signals contained in the input signal $S_T$ with respect to the frequency bands FB1 and FB2 are detected, it is also possible to arrange such that the power amplifier output monitor signal $S_M$ is divided by a divider 20 to the frequency band controller 8 as shown by a broken line in FIG. 8 and frequency bands of signals in the frequency bands FB1 and FB2 are detected from the monitor signal $S_M$.

EFFECTS OF THE INVENTION

As described above, according to the present invention, appropriate distortion compensation can be made for each frequency band by extracting signals of each frequency band from the input signals including signals in a plurality of frequency bands by the variable band signal extractor, and distortion compensation for each frequency band by distortion compensation values read out from the lookup table provided for each frequency band. Specifically, the signals in each frequency band can be amplified by a common power amplifier because a distortion compensation value is added to signals in each frequency band and then the added results are combined by the combiner. Therefore, even if many numbers of frequency band signals to be transmitted exists, the signals in each frequency band can be amplified by the common power amplifier, while performing appropriate distortion compensation in each frequency band. As a result, the present invention can simplify the device and also suppress power consumption and downsize the device.

With the predistorter of the present invention provided for a power amplifier, it is possible to linearly amplify signals in the frequency bands corresponding to the service state of a wireless system. It is advantageous in that the present invention can eliminate additional equipment which would be required as the frequency band changes or carrier waves increase.

The present invention can use the variable band signal extractor consisting of a variable filter to simplify and make affordable the change of the frequency bands. The variable filter can make the center frequency and the bandwidth variable. The variable filter can accommodate the change in the frequency of wireless system by using a single lookup table type predistorter. As such, an operating frequency band of the lookup table type predistorter of the present invention is switched by a frequency switching instruction from an operation center, for example, or an operating frequency band is automatically switched when the frequency band is detected from the input signal. Therefore, the present invention is advantageous as it eliminates operation for executing adjustment with tremendous efforts required in the conventional lookup table type predistorters.

What is claimed is:

1. A multi-band lookup table type predistorter for adding predistortion components for canceling distortion components produced by a power amplifier to an input transmitting signal and outputting the result comprising:

N output side variable band signal extractors for extracting output signals in N frequency bands from output signals from the power amplifier, wherein N is an integer of 2 or greater;

N input side variable band signal extractors for extracting transmitting signals in said N frequency bands from the input transmitting signal;

N difference detectors for detecting differences between transmitting signals in N frequency bands and N output signals from said N output side variable band signal extractors;

N lookup tables for reading distortion compensation data of corresponding N frequency bands by using differences of said N frequency bands as reference signals;

N adders for adding the distortion compensation data read out from said N lookup tables to the transmitting signals in the corresponding N frequency bands;

a combiner for combining the added outputs from said N adders and outputting the combined result as a transmitting signal with the predistortion; and a frequency band controller for controlling frequency bands of said N output side variable band signal extractors and said N output side variable band signal extractors commonly, wherein said frequency band controller comprises, a frequency band detector for detecting signals of N frequency bands from said input transmitting signal, and a band setting unit for controlling said N input side variable band signal extractors and said N output side variable band signal extractors based on said detected signals of the N frequency bands, wherein said frequency band detector comprises a sweep signal generator for generating a sweep signal, a local signal generator for generating a local oscillation signal whose frequency is swept according to said sweep signal, a mixer for multiplying said local oscillation signal by said input transmitting signal, and a low-pass filter for extracting direct current components from output from said mixer and outputting the direct current components as band detecting signal; and said band setting unit references said sweep signals and determines a lower limit frequency, an upper limit frequency and a center frequency of each of the N frequency bands from said band detecting signal and sets the lower limit frequency, the upper limit frequency and the center frequency to said N input side variable band signal extractors and said N output side variable band signal extractors.

2. A multi-band lookup table type predistorter for adding predistortion components for canceling distortion components produced by a power amplifier to an input transmitting signal and outputting the result comprising:

N output side variable band signal extractors for extracting output signals in N frequency bands from output signals from the power amplifier, wherein N is an integer of 2 or greater;

N input side variable band signal extractors for extracting transmitting signals in said N frequency bands from the input transmitting signal;

N difference detectors for detecting differences between transmitting signals in N frequency bands and N output signals from said N output side variable band signal extractors;

N lookup tables for reading distortion compensation data of corresponding N frequency bands by using differences of said N frequency bands as reference signals;

N adders for adding the distortion compensation data read out from said N lookup tables to the transmitting signals in the corresponding N frequency bands;

a combiner for combining the added outputs from said N adders and outputting the combined result as a transmitting signal with the predistortion; and a frequency band controller for controlling frequency bands of said N output side variable band signal extractors and said N output side variable band signal extractors commonly, wherein said frequency band controller comprises a frequency band detector for detecting signals of N frequency bands from said input transmitting signal, and a band setting unit for controlling said N input side variable band signal extractors and said N output side variable band signal extractors based on said detected signals of the N frequency bands, and said frequency band detector comprises converting means for converting said input transmitting signals to frequency domain signals and detecting said N frequency bands; and said band setting unit comprises a level comparator for comparing levels of said N frequency bands with a predetermined threshold and determining the lower limit frequency and the upper limit frequency of each frequency band and means for determining an average of the lower limit frequency and the upper limit frequency of each of said frequency bands from the lower limit frequency and the upper limit frequency as the center frequency.

3. A multi-band lookup table type predistorter for adding predistortion components for canceling distortion components produced by a power amplifier to an input transmitting signal and outputting the result comprising:

N output side variable band signal extractors for extracting output signals in N frequency bands from output signals from the power amplifier, wherein N is an integer of 2 or greater;

N input side variable band signal extractors for extracting transmitting signals in said N frequency bands from the input transmitting signal;

N difference detectors for detecting differences between transmitting signals in N frequency bands and N output signals from said N output side variable band signal extractors;

N lookup tables for reading distortion compensation data of corresponding N frequency bands by using differences of said N frequency bands as reference signals;

N adders for adding the distortion compensation data read out from said N lookup tables to the transmitting signals in the corresponding N frequency bands;

a combiner for combining the added outputs from said N adders and outputting the combined result as a transmitting signal with the predistortion; and a frequency band controller for controlling frequency bands of said N output side variable band signal extractors and said N output side variable band signal extractors commonly, said frequency band controller comprises, a frequency band detector for detecting signals of N frequency bands from said input transmitting signal, and a band setting unit for controlling said N input side variable band signal extractors and said N output side variable band signal extractors based on said detected signals of the N frequency bands, wherein said frequency band detector comprises
- a sweep signal generator for generating a frequency sweep signal,
- a variable filter whose center frequency is swept by said frequency sweep signal, for extracting frequency components at each sweep frequency from said input transmitting signal, and
- a power detector for detecting power of said frequency components; and said band setting unit comprises
- a level comparator for comparing power of said detected frequency components with a threshold and determining the lower level frequency and the upper level frequency of each frequency band, and
- means for determining an average of the lower limit frequency and the upper limit frequency of each of said frequency bands from the lower limit frequency and the upper limit frequency as the center frequency.

* * * * *